(12) United States Patent
Dekkers et al.

(10) Patent No.: US 9,606,458 B2
(45) Date of Patent: Mar. 28, 2017

(54) METHOD FOR CALIBRATION OF AN ENCODER SCALE AND A LITHOGRAPHIC APPARATUS

(71) Applicant: ASML Netherlands B.V., Veldhoven (NL)

(72) Inventors: Jeroen Dekkers, Eindhoven (NL); Andre Bernardus Jeunink, Bergeijk (NL); Erik Roelof Loopstra, Eindhoven (NL); Engelbertus Antonius Fransiscus Van Der Pasch, Oirschot (NL); Michael Jozef Mathijs Renkens, Sittard (NL); Carolus Johannes Catharina Schoormans, Hooge Mierde (NL); Peter Hoekstra, Veldhoven (NL)

(73) Assignee: ASML NETHERLANDS B.V., Veldhoven (NL)

( * ) Notice: Subject to any disclaimer, the term of this patent is extended or adjusted under 35 U.S.C. 154(b) by 43 days.

(21) Appl. No.: 14/430,507

(22) PCT Filed: Sep. 12, 2013

(86) PCT No.: PCT/EP2013/068930
§ 371 (c)(1),
(2) Date: Mar. 23, 2015

(87) PCT Pub. No.: WO2014/053296
PCT Pub. Date: Apr. 10, 2014

(65) Prior Publication Data
US 2015/0241795 A1 Aug. 27, 2015

Related U.S. Application Data

(60) Provisional application No. 61/708,411, filed on Oct. 1, 2012.

(51) Int. Cl.
*G03B 27/68* (2006.01)
*G03F 7/20* (2006.01)
(Continued)

(52) U.S. Cl.
CPC ....... *G03F 7/70775* (2013.01); *G01D 5/2449* (2013.01); *G01D 5/34707* (2013.01);
(Continued)

(58) Field of Classification Search
CPC . G03F 7/70516; G03F 7/70775; G01D 18/00; G01D 18/008; G01D 5/2449; G01D 5/34707
See application file for complete search history.

(56) References Cited

U.S. PATENT DOCUMENTS

| 6,532,791 B2 | 3/2003 | Schmid et al. |
| 7,126,109 B2 | 10/2006 | Goldman et al. |

(Continued)

FOREIGN PATENT DOCUMENTS

| EP | 2 587 224 | 5/2013 |
| JP | H06-317431 | 11/1994 |

(Continued)

OTHER PUBLICATIONS

Japanese Office Action mailed Mar. 15, 2016 in corresponding Japanese Patent Application No. 2015-533523.
(Continued)

*Primary Examiner* — Deoram Persaud
(74) *Attorney, Agent, or Firm* — Pillsbury Winthrop Shaw Pittman LLP

(57) ABSTRACT

A method for calibrating an encoder scale having an array of marks in a first direction, includes moving the encoder scale in the first direction relative to a first encoder-type sensor, a second encoder-type sensor and a third encoder-type sensor, wherein the first encoder-type sensor and the second
(Continued)

encoder-type sensor are fixedly spaced in the first direction at a first distance relative to each other, wherein the second encoder-type sensor and the third encoder-type sensor are fixedly spaced in the first direction at a second distance relative to each other.

14 Claims, 3 Drawing Sheets

(51) Int. Cl.
    *G01D 5/244*     (2006.01)
    *G01D 18/00*     (2006.01)
    *G01D 5/347*     (2006.01)

(52) U.S. Cl.
    CPC .......... *G01D 18/00* (2013.01); *G01D 18/008* (2013.01); *G03F 7/70516* (2013.01)

(56) References Cited

U.S. PATENT DOCUMENTS

| | | | |
|---|---|---|---|
| 7,197,828 B2 | 4/2007 | Lof et al. | |
| 8,446,567 B2 | 5/2013 | Butler et al. | |
| 2006/0023178 A1* | 2/2006 | Loopstra | G03F 7/70458 355/53 |
| 2006/0265889 A1 | 11/2006 | Lof et al. | |
| 2009/0190110 A1* | 7/2009 | Shibazaki | G03F 7/70775 355/53 |
| 2010/0157263 A1* | 6/2010 | Van Eijk | G03B 27/42 355/53 |
| 2013/0099106 A1 | 4/2013 | Kimura | |
| 2015/0168852 A1* | 6/2015 | Beerens | G03F 7/70783 355/72 |

FOREIGN PATENT DOCUMENTS

| | | |
|---|---|---|
| JP | 2005-337757 | 12/2004 |
| JP | 2006-337999 | 12/2006 |
| JP | 2009-252986 | 10/2009 |
| JP | 2012-207923 | 10/2012 |
| JP | 2013-92414 | 5/2013 |

OTHER PUBLICATIONS

International Preliminary Report on Patentability mailed Apr. 16, 2015 in corresponding International Patent Application No. PCT/EP2013/068930.

International Search Report mailed Feb. 20, 2014 in corresponding International Patent Application No. PCT/EP2013/068930.

\* cited by examiner

METHOD FOR CALIBRATION OF AN ENCODER SCALE AND A LITHOGRAPHIC APPARATUS

CROSS-REFERENCE TO RELATED APPLICATIONS

This application is the U.S. National Stage of PCT/EP2013/068930, filed Sep. 12, 2013, which in turn claims the benefit of U.S. provisional application 61/708,411, which was filed on Oct. 1, 2012, the contents of all of these applications being incorporated herein in their entirety by reference.

FIELD

The present invention relates to a method for calibrating an encoder scale.

BACKGROUND

A lithographic apparatus is a machine that applies a desired pattern onto a substrate, usually onto a target portion of the substrate. A lithographic apparatus can be used, for example, in the manufacture of integrated circuits (ICs). In such a case, a patterning device may be used to generate a circuit pattern to be formed on an individual layer of the IC. This pattern can be transferred onto a target on a substrate, e.g. a silicon wafer. The target portion may portion may include part of one or several dies. Transfer of the pattern is typically via imaging onto a layer of radiation-sensitive material provided on the substrate. In general, a single substrate will contain a network of adjacent target portions that are successively patterned. Conventional lithographic apparatus include so-called steppers, in which each target portion is irradiated by exposing an entire pattern onto the target portion at once. Conventional lithographic apparatus also include so-called scanners, in which each target portion is irradiated by scanning the pattern through a radiation beam in a given direction while synchronously scanning the substrate parallel or anti-parallel to this direction. It is also possible to transfer the pattern from the patterning device to the substrate by imprinting the pattern onto the substrate.

In the known lithographic apparatus movable objects, such as a movable substrate support and a movable patterning device support are used. These movable objects may be moved with high accuracy. To determine the position of the movable objects, position measurement systems capable of measuring a position with high accuracy have to be provided. For example, interferometer systems and encoder measurement systems have been provided for high accuracy position measurement of movable objects in a lithographic apparatus.

An encoder-type measurement system comprises at least one encoder-type sensor and an encoder scale, for example on a grid plate or other reference element. The encoder scale comprises an array of scale marks in at least a first direction. The at least one sensor is movable relatively to the encoder scale in at least the first direction and is configured to read the scale marks to determine a change in a relative position between the encoder scale and the at least one sensor in the first direction.

The encoder-type sensor may be mounted on the movable object, such as a movable substrate support or patterning device support, while the encoder scale is mounted or arranged on a reference object, such as a metrology frame. In an alternative embodiment, the encoder scale may be mounted on the movable object and the at least one encoder-type sensor may be arranged on a reference object.

The scale marks on the encoder scale may be optical marks, magnetic marks or other marks. The marks may be arranged at a periodic interval. The scale marks are readable by the encoder-type sensor such that by movement of the sensor relatively to the encoder scale a signal representative of relative movement between the encoder-type sensor and the encoder scale in the first direction may be obtained.

During manufacturing of the encoder scale, the scale marks are provided on the encoder scale. However, for example due to fabrication inaccuracies the scale marks may not be perfectly arranged on the encoder scale. Therefore, calibration of the encoder scale may be required. A first calibration may be performed by the manufacturer of the encoder scale after manufacturing. However, this calibration will not take into account scale errors introduced after the first calibration of the encoder scale.

For instance, during mounting of an encoder scale, for example by gluing, on a frame, errors may be introduced into the encoder scale. Also other causes such as damage of the encoder scale or contamination may result in errors in the encoder scale.

SUMMARY

It is desirable to provide a position measurement system having a high accuracy. In particular, it is desirable to provide a method for calibration of an encoder scale, which may, when desired, be performed in an installed position of the encoder scale, for example in a lithographic apparatus.

According to an embodiment of the invention, there is provided a method for calibrating an encoder scale having an array of marks in a first direction. The method comprises the steps of:

moving the encoder scale in the first direction relative to a first encoder-type sensor, a second encoder-type sensor and a third encoder-type sensor, wherein the first encoder-type sensor and the second encoder-type sensor are fixedly spaced in the first direction at a first distance relative to each other, wherein the second encoder-type sensor and the third encoder-type sensor are fixedly spaced in the first direction at a second distance relative to each other, obtaining, while moving, a first signal from the first encoder-type sensor, a second signal from the second encoder-type sensor and a third signal from the third encoder-type sensor, wherein the first signal is based on the array of marks and is representative of a position quantity of the encoder scale relative to the first encoder-type, wherein the second signal is based on the array of marks and is representative of a position quantity of the encoder scale relative to the second encoder-type sensor, wherein the third signal is based on the array of marks and is representative of a position quantity of the encoder scale relative to the third encoder-type sensor, creating, while taking into account the first distance and the second distance, a first position signal based on the first signal, a second position signal based on the second signal, and a third position signal based on the third signal, creating a comparison by comparing the first position signal, the second position signal and the third position signal with each other, determining on the basis of the comparison a calibration map for the encoder scale.

According to a further embodiment of the invention, there is provided a lithographic apparatus comprising a moveable object, an encoder scale having an array of marks in the first direction, a first encoder-type sensor, a second encoder-type sensor, a third encoder-type sensor and a controller. The moveable object is moveable in a first direction. The first encoder-type sensor is configured to provide a first signal that is based on the array of marks and that is representative of a position quantity of the encoder scale relative to the first encoder-type The second encoder-type sensor is configured to provide a second signal that is based on the array of marks and that is representative of a position quantity of the encoder scale relative to the second encoder-type sensor. The third encoder-type sensor is configured to provide a third signal is based on the array of marks and is representative of a position quantity of the encoder scale relative to the third encoder-type sensor. The first encoder-type sensor and the second encoder-type sensor are fixedly spaced in the first direction at a first distance relative to each other. The second encoder-type sensor and the third encoder-type sensor are fixedly spaced in the first direction at a second distance relative to each other. The controller is arranged to calibrate the encoder scale by obtaining, during movement of the moveable object, the first signal, the second signal and the third signal, creating, while taking into account the first distance and the second distance, a first position signal based on the first signal, a second position signal based on the second signal, and a third position signal based on the third signal, creating a comparison by comparing the first position signal, the second position signal and the third position signal with each other, determining on the basis of the comparison a calibration map for the encoder scale.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

Figure 1:
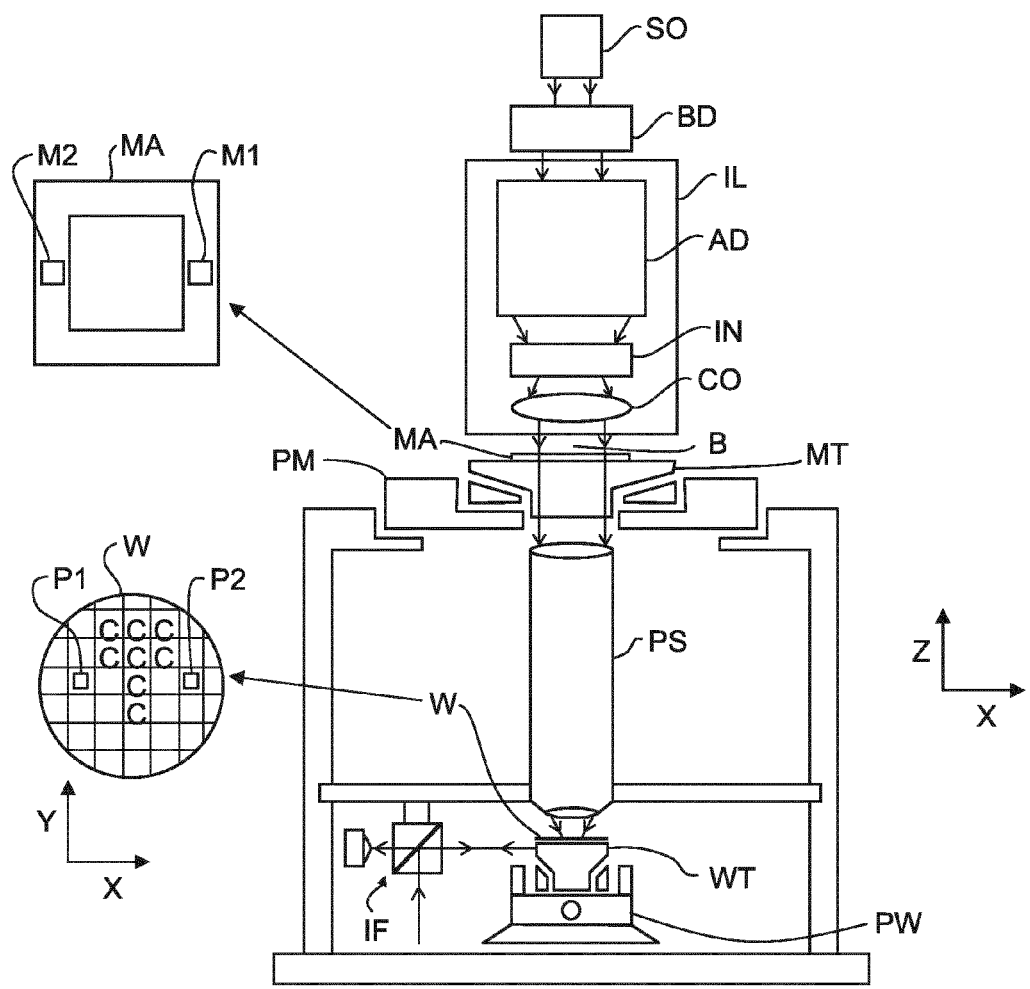
FIG. 1 depicts a lithographic apparatus according to an embodiment of the invention.

FIG. 1 schematically depicts a lithographic apparatus according to one embodiment of the invention. The apparatus includes an illumination system IL, a support structure MT, a first positioning device PM, a substrate table WT, a second positioning device PW and a projection system PS. The illumination system IL is configured to condition a radiation beam B. The support structure MT is constructed to support a patterning device MA and is connected to the first positioning device PM configured to accurately position the patterning device MA in accordance with certain parameters. The substrate table WT is constructed to hold a substrate W, e.g. a resist-coated wafer. The substrate table WT is connected to a second positioning device PW configured to accurately position the substrate W in accordance with certain parameters. The projection system PS is configured to project a pattern imparted to the radiation beam B by patterning device MA onto a target portion C of the substrate W.

The term "radiation beam" used herein encompass all types of electromagnetic radiation, including ultraviolet (UV) radiation (e.g. having a wavelength of or about 365, 248, 193, 157 or 126 nm) and extreme ultra-violet (EUV) radiation (e.g. having a wavelength in the range of 5-20 nm), as well as particle beams, such as ion beams or electron beams.

The illumination IL system may include various types of optical components, such as refractive, reflective, magnetic, electromagnetic, electrostatic or other types of optical components, or any combination thereof, for directing, shaping, or controlling radiation.

The support structure MT supports, i.e. bears the weight of, the patterning device MA. The support structure MT holds the patterning device MA in a manner that depends on the orientation of the patterning device MA, the design of the lithographic apparatus, and other conditions, such as for example whether or not the patterning device MA is held in a vacuum environment. The support structure MT can use mechanical, vacuum, electrostatic or other clamping techniques to hold the patterning device MA. The support structure MT may be a frame or a table, for example, which may be fixed or movable as required. The support structure MT may ensure that the patterning device MA is at a desired position, for example with respect to the projection system PS.

The term "patterning device" used herein should be broadly interpreted as referring to any device that can be used to impart a radiation beam with a pattern in its cross-section so as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion C, such as an integrated circuit.

The patterning device MA may be transmissive or reflective. Examples of patterning devices include masks, reticles, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum.

As here depicted, the apparatus is of a transmissive type, since the apparatus employs a transmissive mask. Alternatively, the apparatus may be of a reflective type and employ a programmable mirror array of a type as referred to above, or employ a reflective mask.

The lithographic apparatus may be of a type having at least one substrate table WT and at least one support structure MT. Additional substrate tables WT or support structures MT may be used in parallel, or preparatory steps may be carried out on one or more substrate tables WT or support structures MT while one or more other substrate tables WT or support structures MT are being used for exposure. The lithographic apparatus may have a measurement stage for moving measurement equipment relative to the projection system PS. The measurement stage may not be suited for holding a substrate.

The lithographic apparatus may also be of a type wherein at least a portion of the substrate may be covered by a liquid having a relatively high refractive index, e.g. water, so as to fill a space between the projection system and the substrate. An immersion liquid may also be applied to other spaces in the lithographic apparatus, for example, between the patterning device MA and the projection system. Immersion techniques can be used to increase the numerical aperture of projection systems. The term "immersion" as used herein does not mean that a structure, such as a substrate W, must be submerged in liquid, but rather only means that a liquid is located between the projection system PS and the substrate W during exposure.

Referring to FIG. 1, the illumination system IL receives a radiation beam from a source SO. The source SO and the lithographic apparatus may be separate entities, for example when the source SO is an excimer laser. In such cases, the source SO is not considered to form part of the lithographic apparatus and the radiation beam is passed from the source SO to the illumination system IL with the aid of a beam delivery system BD including, for example, suitable directing mirrors and/or a beam expander. In other cases the source SO may be an integral part of the lithographic apparatus, for example when the source SO is a mercury lamp. The source SO and the illumination system IL, together with the beam delivery system BD if required, may be referred to as a radiation system.

The illumination system IL may include an adjuster AD configured to adjust the angular intensity distribution of the radiation beam. In addition, the illumination system IL may include various other components, such as an integrator IN and a condenser CO. The illumination system IL may be used to condition the radiation beam, to have a desired uniformity and intensity distribution in its cross-section.

The radiation beam B is incident on the patterning device MA, which is held on the support structure MT, and is patterned by the patterning device MA. Having traversed the patterning device MA, the radiation beam B passes through the projection system PS, which focuses the beam onto a target portion C of the substrate W. With the aid of the second positioning device PW and position measurement system IF (e.g. comprising an interferometric device, an encoder-type sensor or a capacitive sensor), the substrate table WT can be moved accurately, e.g. so as to position different target portions C in the path of the radiation beam B. Similarly, the first positioning device PM and another position measurement system (which is not explicitly depicted in FIG. 1) can be used to accurately position the patterning device MA with respect to the path of the radiation beam B. In general, movement of the support structure MT may be realized with the aid of a long-stroke module and a short-stroke module, which form part of the first positioning device PM. The long-stroke module is for coarse positioning the short-stroke module relative to the projection system PS. The short-stroke module is for fine positioning the patterning device MA relative to the long-stroke module. Similarly, movement of the substrate table WT may be realized using a long-stroke module and a short-stroke module, which form part of the second positioner PW. In the case of a stepper, as opposed to a scanner, the support structure MT may be connected to a short-stroke actuator only, or may be fixed. The patterning device MA and the substrate W may be aligned using patterning device alignment marks M1, M2 and substrate alignment marks P1, P2. Although the substrate alignment marks P1, P2 as illustrated occupy dedicated target portions, they may be located in spaces between target portions C. Similarly, in situations in which more than one die is provided on the patterning device MA, the patterning device alignment marks M1, M2 may be located between the dies.

The depicted apparatus could be used in at least one of the following three modes:

In the first mode, the so-called step mode, the support structure MT and the substrate table WT are kept essentially stationary, while an entire pattern imparted to the radiation beam is projected onto a target portion C at one time. The substrate table WT is then shifted in the X and/or Y direction so that a different target portion C can be exposed. In step mode, the maximum size of the exposure field limits the size of the target portion C imaged in a single static exposure.

In a second mode, the support structure MT and the substrate table WT are scanned synchronously while a pattern imparted to the radiation beam is projected onto a target portion C. The velocity and direction of the substrate table WT relative to the support structure MT may be determined by the (de-)magnification and image reversal characteristics of the projection system PS. In scan mode, the maximum size of the exposure field limits the width, i.e, in the non-scanning direction, of the target portion in a single dynamic exposure, whereas the length of the scanning motion determines the height (in the scanning direction) of the target portion C.

In a third mode, the support structure MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Figure 2:
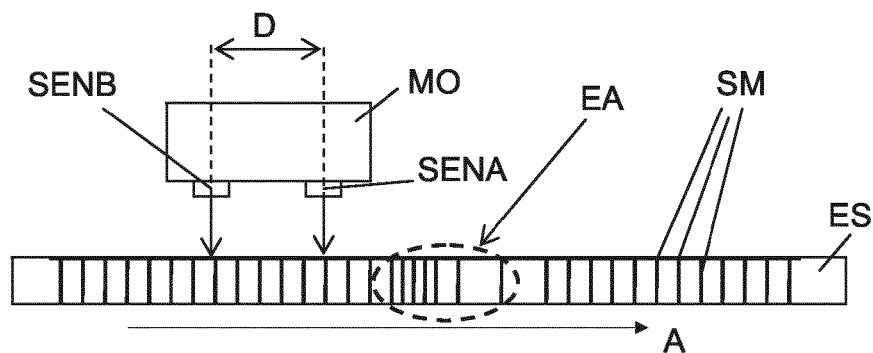
FIG. 2 depicts schematically a view on an encoder scale and a set of two encoder-type sensors according to an embodiment of the invention.

FIG. 2 depicts schematically a top view on an encoder scale ES. The encoder scale ES is a one-dimensional encoder scale and comprises an array of scale marks SM in a measurement direction indicated by arrow A. The array may be a period array. The scale marks SM are optical scale marks, for instance relative dark lines or areas, which are readable by two encoder-type sensors SENA, SENB. The encoder-type sensors SENA, SENB are arranged on a movable object MO which is movable in the measurement direction A.

In the description below, the encoder-type sensors SENA and SENB will be indicated by the shorter term 'sensor SENA' and 'sensor SENB'.

When the movable object MO is moved along the encoder scale ES, the sensors SENA, SENB are configured to read the scale marks SM to determine a position quantity of the encoder scale ES relative to the sensors SENA and SENB in the measurement direction A. The position quantity may be a position, a velocity, an acceleration or any other time derivative thereof. The position quantity may be a change in position. In an embodiment, the sensors SENA, SENB are configured to count the number of scale marks that are passed by to determine a coarse change in position, and, are configured to determine within the range of a few scale marks SM, a fine absolute position of the sensor with respect to these few scale marks SM. By addition of these two position data, an absolute position of the sensor with respect to the whole encoder scale ES, and thus the movable object MO in the measurement direction A may be determined.

It is remarked, that one sensor SENA, SENB can be used to determine a position of the movable object MO in the measurement direction A. By providing multiple sensors SENA, SENB for multiple measurement directions, the position of the movable object in multiple degrees of freedom may be determined. For example, in an orthogonal xyz coordinate system a position in x, y, z, Rx, Ry, and Rz may be determined by six sensors SENA, SENB providing sensor signals for all measurement directions, such as three z sensors, two x sensors and one y-sensor.

The array of scale marks SM of the encoder scale ES in the measurement direction A may not have to be perfect arranged on the encoder scale, for example at perfect equal distances. To correct for this imperfection, calibration of the encoder scale ES may be desirable. Calibration of the encoder scale ES usually takes place after manufacturing the encoder scale ES by the manufacturer. A calibration map of the encoder scale ES is provided together with the encoder scale ES. However, also after manufacturing errors may come into existence in the periodic array of scale marks SM, for example due to damage or contamination. Also, mounting of the encoder scale ES, for example on a frame, may result in introduction of errors in the encoder scale ES.

In the encoder scale ES shown in FIG. 2 an error area EA, i.e. a part of the encoder scale, where the scale marks are not arranged equidistantly, is indicated.

FIG. 2 shows a system to perform a method for calibrating the encoder scale ES in accordance with an embodiment of the invention. On the movable object MO two sensors SENA, SENB configured to read the scale marks SM of the encoder scale ES. Sensors SENA, SENB are fixedly spaced at a fixed distance D with respect to each other in the measurement direction A. Fixedly spaced means that the position of the sensors SENA and SENB relative to each other is fixed. The distance D may be selected substantially smaller than the length of the encoder scale ES in the measurement direction A.

By moving the movable object MO and the sensors SENA, SENB in the measurement direction A relatively to the encoder scale ES, sensor signals of the two sensors SENA, SENB, representative of a position of the two sensors SENA, SENB relative to the encoder scale ES can be obtained. The movement may be performed with a constant speed over the whole length of the encoder scale ES. An error in the encoder scale ES can be determined by using the sensor signals obtained during the movement.

Figure 3:
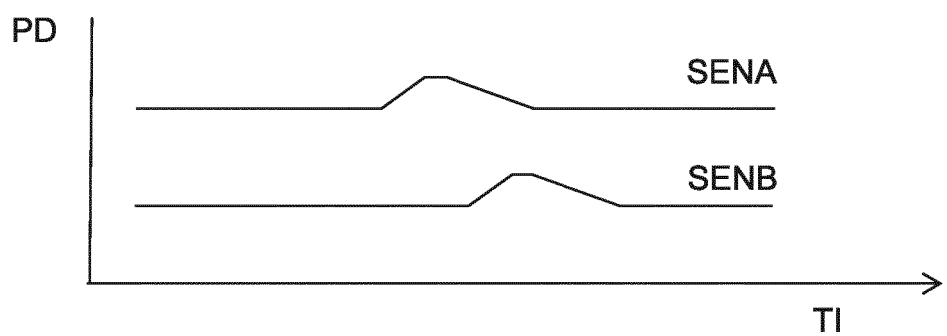
FIGS. 3 and 4 show graphs of the measured position deviation in relation to time and true position, respectively.
Figure 4:
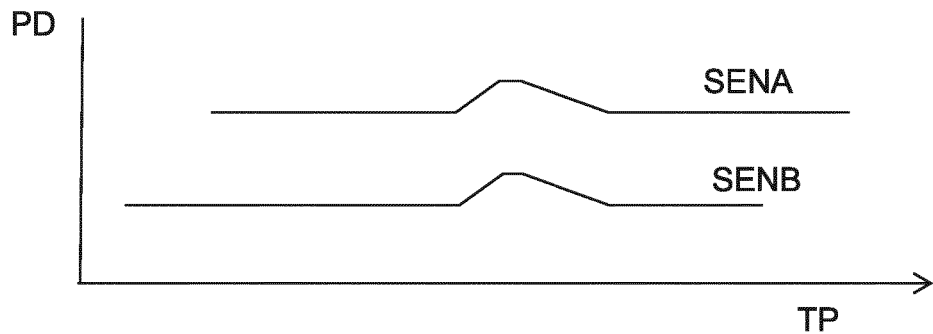

FIGS. 3 and 4 show examples of information obtained with a movement of the sensors SENA, SENB along the encoder scale ES in the measurement direction A. The sensor SENA provides a sensor signal representative of a position quantity of the encoder scale relative to the sensor SENA in the measurement direction A. The sensor SENB provides a sensor signal representative of a position quantity of the encoder scale relative to the sensor SENB in the measurement direction A. However, due to the error area EA in the encoder scale the measured position does not have to be the true position.

In FIGS. 3 and 4 the position data based on the sensor signals are indicated as measured position deviation PD in relation to time TI (FIG. 3) and true position TP (FIG. 4). The position data of the first sensor SENA and the second sensor SENB are indicated in the drawing, for clarity, at different height levels.

When the scale marks SM of the encoder scale ES would be perfectly aligned at equal intervals, the measured position deviation would be constant and would be the same for both the sensors SENA, SENB over the whole measurement range. However, due to the error area EA in the encoder scale ES, it can be seen that there is a deviation from the constant level. In time perspective, the first sensor SENA first passes the error area EA and shows, as a result, a first deviation. Thereafter, the second sensor SENB passes the error area and shows the same deviation.

Since the first sensor SENA and the second sensor SENB have corresponding deviations in their measured position deviations at a time interval related to the distance D, the deviation of the first and second sensors SENA and SENB due to the error area EA can be determined by comparison of the sensor signals of the sensors SENA, SENB. The sensor signals of the sensors SENA and SENB in FIG. 3 are signals as function of time. These signals can be used to create signals as function of position by taking into account the fixed distance D between the sensors SENA, SENB. The signals as function of position are shown in FIG. 4. By comparing the signals of FIG. 4 with each other, the deviation in both sensor signals can be determined. The deviation in both sensor signals indicates the presence of an error in the encoder scale. This deviation can be used to create a calibration map that for example can be stored in a memory of the controller of the position measurement system. It is remarked that a calibration map may be any means or device in which a relationship between sensors signals of the sensors and the true position is recorded.

In FIG. 4, the measured position deviation is compared with the true position of the sensors SENA, SENB. This data can be used as a calibration map, so that during use of the position measurement system, the measured positions can be translated in the true position using this calibration map.

It is remarked that in the embodiment of FIG. 2, two sensors SENA, SENB are provided and used to calibrate the encoder scale ES. Since only two sensors are used, the spatial frequency content of the encoder scale having a harmonic and/or a higher harmonic of distance D cannot be observed by the two sensors SENA, SENB. A harmonic of distance D is a spatial frequency having a period with the length of distance D. A higher harmonic of distance D is a spatial frequency having a period, wherein the length of a plurality of periods equals the distance D. Not observing this spatial frequency content may lead to a calibration error.

To further increase the accuracy with which the encoder scale ES can be calibrated three or more sensors may be provided on the movable object MO. The further sensors may be similar to the sensors SENA and SENB described above. Each of these further sensors is configured to read the encoder scale ES in the measurement direction A, and the sensors are fixedly spaced in the measurement direction A. The sensors may be arranged on a single line in the measurement direction A, so that all sensors cross the same irregularities in the encoder scale ES.

When the three or more sensors comprise a first sensor, a second sensor and a third sensor, the first sensor and the second sensor may be fixedly spaced in the measurement direction A at a first distance, and the second sensor and the third sensor may be fixedly spaced in the measurement direction A at a second distance. The first and second distance are different so that the spatial frequency content of the encoder scale which cannot be observed due to the first distance between the sensors SENA, SENB, will be observed by the second and third sensor spaced at a second distance.

In an embodiment the first distance is larger than the second distance. By selecting the first distance to be unequal to a plurality of times the second distance, it can be avoided that harmonics or higher harmonics of the first and second distance cannot be observed by the measurement signals of the three sensors.

For example, the first distance can be selected to be 5 mm or 50 mm, and the second distance 51 mm.

Another benefit of using three or more sensors at fixed distances in one measurement direction is the reduction of calibration uncertainty with respect to sensor measurement uncertainty of each of the sensors. This benefit is independent of the selected distances between the respective sensors.

The calibration method of an embodiment of the invention can be performed with the position measurement system itself, and can therefore to be used in an installed configuration of the position measurement system, for example in a lithographic apparatus.

Figure 5:
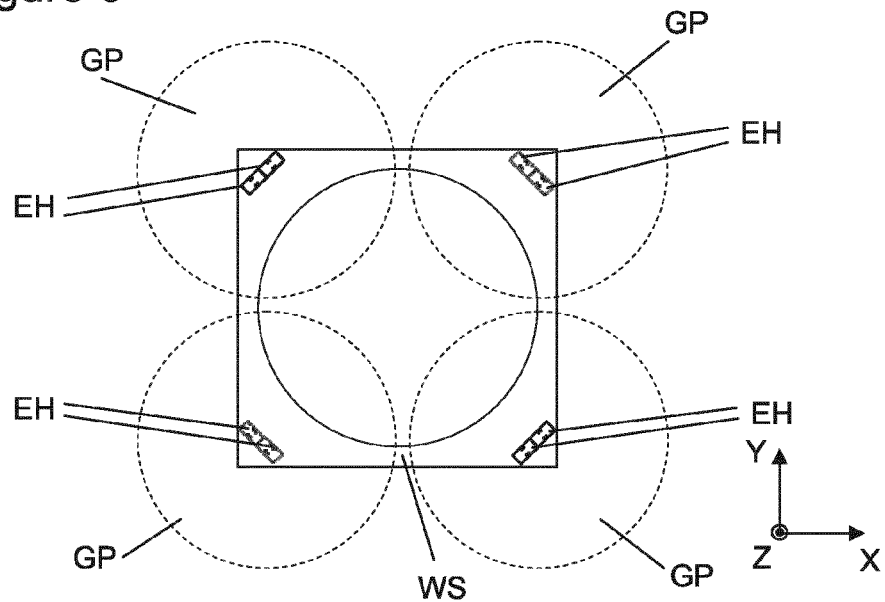
FIG. 5 depicts a schematic top view of an encoder-type measurement system of a substrate stage in a lithographic apparatus according to an embodiment of the invention.

FIG. 5 shows a top view of a movable stage of a lithographic apparatus, in particular a substrate stage WS. The substrate stage WS comprises the substrate table WT and the second positioner PW. The position of the substrate stage WS should be controlled with high accuracy. An encoder-type measurement system is provided to determine the position of the substrate stage WS.

The encoder type measurement system comprises four grid plates GP each comprising a two dimensional encoder scale. The grid plates GP are indicated by dashed circles indicating a main measurement area of the grid plates GP. In practice, the grid plates GP may have rectangular or other suitable shapes, and may for example be arranged in abutting relationship.

Each corner of the substrate stage WS comprises two encoder heads EH. Since all encoder heads EH are located at a fixed position with respect to the substrate stage WS, the encoder heads EH are arranged at fixed distances with respect to each other.

Each encoder head EH comprises a sensor SENA, SENB and a distance sensor. The distance sensor is configured to provide a sensor signal representative of a position quantity in the direction perpendicular to a grid plate GP, in this embodiment the Z-direction. The sensor SENA, SENB is arranged to provide a sensor signal representative of a position quantity in a direction parallel to the grid plate GP, in this embodiment the X-Y plane. The distance sensor measures the distance between the distance sensor and the grid plate GP. Such distance sensor may use the scale marks SM for position measurement or use another measurement principle, for example reflection of a measurement beam on the grid plates GP.

On the basis of sensor signals obtained from three encoder heads EH, the position of the substrate stage WS can be determined in six degrees of freedom.

Since further encoder heads are present, these encoder heads EH may be used for calibration of the grid plates GP in the lithographic apparatus using the calibration method of the present invention. This has the benefit that errors in the grid plate GP as a result of mounting the grid plates GP in the lithographic apparatus and/or errors due to contamination or other causes can be determined and calibrated with the lithographic apparatus itself.

During the calibration the substrate stage WS will be moved multiple times in a first measurement direction and in a second measurement direction, perpendicular to the first measurement direction, with respect to the grid plates GP, to cover all areas of the grid plates GP that have to be calibrated.

It is remarked that for the distance sensors, a similar calibration method may be used, wherein while moving at least two distance sensors in the second measurement direction relative to the grid plate GP, distance sensor signals are obtained. These distance sensor signals of the at least two distance sensors may be compared taking into account the fixed distance between the at least two distance sensors. A straightness calibration map of the grid plate GP may be determined on the basis of the comparison of the distance sensor signals.

By using at least 7 encoder heads the whole position measurement system can be calibrated in all six degrees of freedom.

In the embodiment of FIG. 5, the substrate stage WS is the moveable object MO described above. In a lithographic apparatus, the invention may be applied to other moveable objects MO, such as the support structure MT.

Instead of four grid plates GP, each with a two-dimensional encoder scale, a different number of grid plates GP may be used. A grid plate GP may have one or two one-dimensional encoder scales ES.

However, since the position measurement system of the lithographic apparatus may not be optimized for grid plate calibration, this calibration in the lithographic apparatus may have some limitations.

For example, the configuration of the encoder head EH may not be optimized for calibration, but for position measurement. Also, the number of encoder heads EH may still be relative small for optimal calibration results. Further, the substrate stage WS may provide limited stability between the encoder heads EH which results in a lower stability of the fixed distances between the encoder heads EH.

Therefore, it may be desirable to provide a calibration apparatus which may comprise a movable stage system which has a similar construction with respect to the construction of the substrate stage WS of FIG. 5, but which is optimized for calibration of the grid plates GP. Such separate calibration apparatus may also have the benefit that more time for calibration may be available than when the grid plates GP are mounted in the lithographic apparatus.

When using such calibration apparatus, the errors on the grid plates GP should minimally be influenced, when the grid plates GP are transferred between the calibration apparatus and the lithographic apparatus. This may for instance be obtained by mounting one or more grid plates GP on a grid plate frame which is transferred together with the one or more grid plates GP between the calibration apparatus and the lithographic apparatus.

Figure 6:
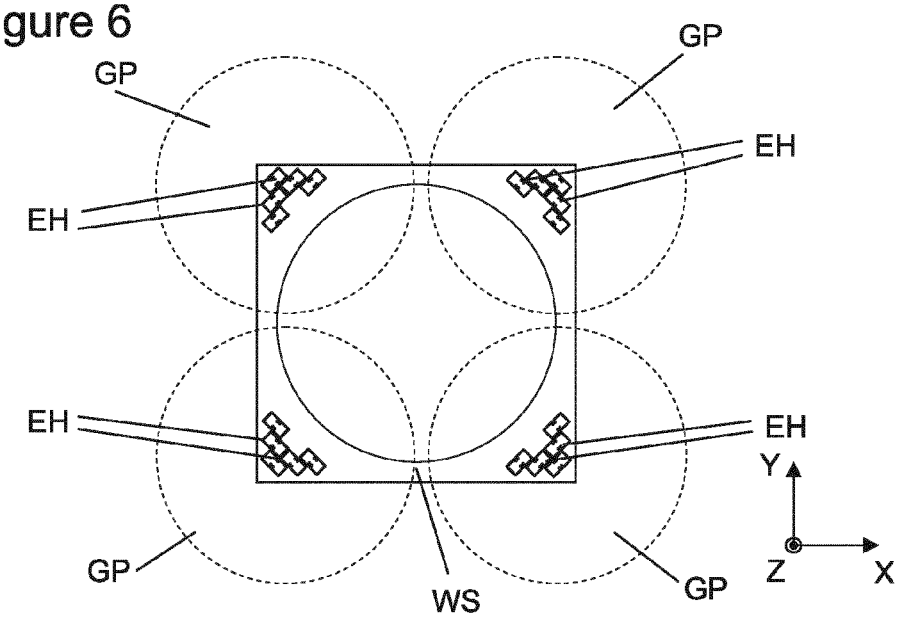
FIG. 6 depicts a schematic top view of a calibration tool for calibration of a grid plate/an encoder scale according to an embodiment of the invention.

FIG. 6 shows a top view of a calibration apparatus that may be used to perform the calibration method of the invention. The main difference between the calibration apparatus of FIG. 6 and the lithographic apparatus of FIG. 5, is that in each corner area five encoder heads EH with each a sensor SENA, SENB and a distance sensor. Since more encoder heads EH are provided for each grid plate GP, the calibration errors can further be reduced.

Further, since the calibration apparatus is optimized for calibration, the position of the sensors may be optimally selected for calibration of the grid plates. For example, three or more sensors may be arranged on a line in a measurement direction to improve calibration results. Also, the stability between the encoder heads may be improved by making the connection between the different sensors relatively stiff compared to the substrate stage WS of the lithographic apparatus.

In the embodiments mentioned above, the scale marks SM of the encoder scale ES are optical marks. However, other types of marks may be used, for example magnetic marks. Magnetic marks may be less sensitive to certain types of contamination.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

Although specific reference may have been made above to the use of embodiments of the invention in the context of optical lithography, it will be appreciated that the invention may be used in other applications, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

While specific embodiments of the invention have been described above, it will be appreciated that the invention may be practiced otherwise than as described. For example, the invention may take the form of a computer program containing one or more sequences of machine-readable instructions describing a method as disclosed above, or a data storage medium (e.g. semiconductor memory, magnetic or optical disk) having such a computer program stored therein.

The descriptions above are intended to be illustrative, not limiting. Thus, it will be apparent to one skilled in the art that modifications may be made to the invention as described without departing from the scope of the claims set out below.

What is claimed is:

1. A method for calibrating an encoder scale having an array of marks in a first direction, comprising:
    moving the encoder scale in the first direction relative to a first encoder-type sensor, a second encoder-type sensor and a third encoder-type sensor, wherein the first encoder-type sensor and the second encoder-type sensor are fixedly spaced in the first direction at a first distance relative to each other, wherein the second encoder-type sensor and the third encoder-type sensor are fixedly spaced in the first direction at a second distance relative to each other, wherein the first distance is larger than the second distance;
    obtaining, while moving, a first signal from the first encoder-type sensor, a second signal from the second encoder-type sensor and a third signal from the third encoder-type sensor,
    wherein the first signal is based on the array of marks and is representative of a position quantity of the encoder scale relative to the first encoder-type,
    wherein the second signal is based on the array of marks and is representative of a position quantity of the encoder scale relative to the second encoder-type sensor,
    wherein the third signal is based on the array of marks and is representative of a position quantity of the encoder scale relative to the third encoder-type sensor,
    creating, while taking into account the first distance and the second distance, a first position signal based on the first signal, a second position signal based on the second signal, and a third position signal based on the third signal;
    creating a comparison by comparing the first position signal, the second position signal and the third position signal with each other, and
    determining on the basis of the comparison a calibration map for the encoder scale.

2. The method of claim 1, wherein the comparison comprises determining a measurement error between at least two of the first position signal, the second position signal and the third position signal, and wherein determining the calibration map comprises mapping the corresponding measurement errors.

3. The method of claim 1, wherein moving the encoder scale in the first direction relative to the first encoder-type sensor, the second encoder-type sensor and the third encoder-type sensor is at a constant speed.

4. The method of claim 1, wherein the first distance is unequal to a plurality of times the second distance.

5. The method of claim 1, wherein the first distance and the second distance are substantially smaller than a length of the encoder scale in the first direction.

6. The method of claim 1, wherein the method is applied in a position measurement system of a lithographic apparatus.

7. The method of claim 1, wherein the method is applied in a calibration tool.

8. The method of claim 1, comprising:
    obtaining, while moving, a first distance signal and a second distance signal, wherein the first distance signal is representative of a distance perpendicular to the first direction between the encoder scale and one of the first encoder-type sensor, the second encoder-type sensor and the third encoder-type sensor, wherein the second distance signal is representative of a distance perpendicular to the first direction between the encoder scale and one of the other of the first encoder-type sensor, the second encoder-type sensor and the third encoder-type sensor;
    creating, while taking into account the first distance and the second distance, a first distance position signal based on the first distance signal, and a second distance position signal based on the second distance signal, creating a further comparison by comparing the first distance position signal and the second distance position signal with each other, and determining on the basis of the further comparison, a straightness calibration map of the encoder scale.

9. A lithographic apparatus comprising:
a moveable object;
an encoder scale having an array of marks in the first direction;
a first encoder-type sensor;
a second encoder-type sensor;
a third encoder-type sensor; and
a controller,
wherein the moveable object is moveable in a first direction,
wherein the first encoder-type sensor is configured to provide a first signal that is based on the array of marks and that is representative of a position quantity of the encoder scale relative to the first encoder-type,
wherein the second encoder-type sensor is configured to provide a second signal that is based on the array of marks and that is representative of a position quantity of the encoder scale relative to the second encoder-type sensor,
wherein the third encoder-type sensor is configured to provide a third signal is based on the array of marks and is representative of a position quantity of the encoder scale relative to the third encoder-type sensor,
wherein the first encoder-type sensor and the second encoder-type sensor are fixedly spaced in the first direction at a first distance relative to each other,
wherein the second encoder-type sensor and the third encoder-type sensor are fixedly spaced in the first direction at a second distance relative to each other,
wherein the first distance is larger than the second distance,
wherein the controller is arranged to calibrate the encoder scale by obtaining, during movement of the moveable object, the first signal, the second signal and the third signal, creating, while taking into account the first distance and the second distance, a first position signal based on the first signal, a second position signal based on the second signal, and a third position signal based on the third signal, creating a comparison by comparing the first position signal, the second position signal and the third position signal with each other, and determining on the basis of the comparison a calibration map for the encoder scale.

10. The lithographic apparatus of claim 9, wherein the first encoder-type sensor, the second encoder-type sensor and the third encoder-type sensor are arranged on a straight line in the first direction.

11. The lithographic apparatus of claim 9, wherein the controller is arranged to, when creating the comparison, determine a measurement error between at least two of the first position signal, the second position signal and the third position signal, and wherein the controller is arranged to map the corresponding measurement errors during determining the calibration map.

12. The lithographic apparatus of claim 9, wherein the controller is arranged to obtain the first signal, the second signal and the third signal during a movement of the moveable object at a constant speed.

13. The lithographic apparatus of claim 9, wherein the larger of the first distance and the second distance is different from an integer times the smaller of the first distance and second distance.

14. The lithographic apparatus of claim 9, wherein the first distance and the second distance are substantially smaller than a length of the encoder scale in the first direction.

* * * * *